US 6,567,269 B2

(12) United States Patent
Homer et al.

(10) Patent No.: US 6,567,269 B2
(45) Date of Patent: May 20, 2003

(54) COMPUTER SYSTEM HAVING REMOVABLE PROCESSOR AND MODULAR THERMAL UNIT

(75) Inventors: Steven S. Homer, Tomball, TX (US); Jeffery A. Lev, Houston, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 09/840,579

(22) Filed: Apr. 23, 2001

(65) Prior Publication Data

US 2002/0154483 A1 Oct. 24, 2002

(51) Int. Cl.[7] .................................................. H05K 7/20
(52) U.S. Cl. ..................... 361/700; 361/690; 361/695; 361/697; 361/704; 361/719; 174/15.2; 174/16.3; 165/80.4
(58) Field of Search ......................... 361/687–690, 361/694–700, 717–720; 257/712–715, 721, 722; 174/15.1, 15.2, 16.1, 16.3; 165/80.3, 80.4, 185; 312/223.2

(56) References Cited

U.S. PATENT DOCUMENTS

| | | | | |
|---|---|---|---|---|
| 5,424,913 A | * | 6/1995 | Swindler ..................... 361/687 |
| 5,559,675 A | * | 9/1996 | Hsieh et al. ................. 361/707 |
| 5,810,554 A | * | 9/1998 | Yokozawa et al. ........... 415/176 |
| 5,835,348 A | * | 11/1998 | Ishida ......................... 361/699 |
| 5,875,095 A | * | 2/1999 | Webb ......................... 361/700 |
| 5,930,115 A | * | 7/1999 | Tracy et al. ................. 361/704 |
| 5,966,286 A | * | 10/1999 | O'Connor et al. ........... 361/699 |
| 5,969,940 A | * | 10/1999 | Sano et al. .................. 361/687 |
| 6,058,009 A | * | 5/2000 | Hood, III et al. ........... 361/687 |
| 6,125,035 A | * | 9/2000 | Hood, III et al. ........... 361/687 |
| 6,137,681 A | * | 10/2000 | Lu .............................. 361/697 |
| 6,226,178 B1 | * | 5/2001 | Broder et al. ........... 165/104.33 |
| 6,301,107 B1 | * | 10/2001 | Lev et al. .................... 361/670 |
| 6,304,441 B1 | * | 10/2001 | Han ........................... 165/80.3 |
| 6,311,767 B1 | * | 11/2001 | Inoue et al. ................ 165/80.4 |
| 6,351,382 B1 | * | 2/2002 | Nakanishi et al. ......... 165/80.3 |
| 6,373,700 B1 | * | 4/2002 | Wang ..................... 165/104.33 |
| 6,407,921 B1 | * | 6/2002 | Nakamura et al. ..... 165/104.33 |
| 6,421,239 B1 | * | 8/2002 | Huang ........................ 361/696 |
| 6,442,025 B2 | * | 8/2002 | Nakamura et al. .......... 361/695 |

* cited by examiner

Primary Examiner—Boris Chervinsky
(74) Attorney, Agent, or Firm—Fletcher, Yoder & Van Someren

(57) ABSTRACT

An electronic device system having a removable processor and a removable modular thermal unit. The electronic device enabling a first modular thermal and processor installed within the electronic device to be replaced by a second modular thermal unit and processor. The second processor producing a different amount of heat than the first processor and the second modular thermal unit providing a different amount of cooling than the first modular thermal unit.

21 Claims, 4 Drawing Sheets

COMPUTER SYSTEM HAVING REMOVABLE PROCESSOR AND MODULAR THERMAL UNIT

FIELD OF THE INVENTION

The present invention relates generally to a computer system, and particularly to a computer system having a removable processor and a removable modular thermal unit for removing heat from the processor.

BACKGROUND OF THE INVENTION

A computer system is typically comprised of a variety of different components housed within an enclosure. For example, a typical computer has a hard drive for permanently storing data, such as computer programs. A typical computer also has a processor that controls the operation of the computer in accordance with the computer programming stored in the hard drive. A typical computer also uses temporary memory, or RAM, to transfer data between the hard drive and the processor. The computer may also have additional components, such as a power supply to supply power to the hard drive, processor and RAM.

Electronic devices can generate substantial amounts of heat. Heat can damage or even destroy electronic components. A cooling fan is typically used to cool the electronic components within a computer. However, the typical computer system is not configured Additionally, the speed and computing power of processors is constantly improving. Typically, the heat produced by the processor also increases with speed and computing power.

Improvements in processor technology may encourage the replacement of the processor within a computer with a more powerful processor. However, the existing cooling fan or other cooling system components may not be able to remove the additional heat generated by a more powerful processor. Additionally, the typical computer is not configured for replacement of a cooling fan or any other component used to cool the electronic components within the computer Therefore, it would be advantageous to have a computer that would enable a processor to be removed and replaced with a more powerful processor that produces a greater amount of heat, and which would enable the components used to cool the processor to be replaced with components that can remove the greater amount of heat produced by the more powerful processor.

SUMMARY OF THE INVENTION

According to one aspect of the present invention, a computer system having a removable processor and a removable modular thermal unit is featured. The removable modular thermal unit is disposed adjacent to the removable processor to remove heat from the processor.

According to another aspect of the present invention, a method of operating a computer system is featured. The method comprises removing a first modular thermal unit and a first removable processor from the computer system. The method also comprises installing a second removable processor and a second modular thermal unit into the computer system.

According to another aspect of the present invention, a computer system is featured. The computer system comprises an enclosure, a first mounting assembly, and a second mounting assembly. The first mounting assembly is disposed within the enclosure. The first mounting assembly is adapted to hold a removable processor. Additionally, a second mounting assembly is disposed within the enclosure. The second mounting assembly is adapted to secure a removable modular thermal unit to the enclosure.

According to another aspect of the present invention, a method of assembling an electronic device is featured. The method comprises configuring a first removable modular thermal unit to remove heat produced by a first removable processor. Additionally, the method comprises installing the first removable processor and first removable modular thermal unit in the electronic device.

BRIEF DESCRIPTION OF THE DRAWINGS

The invention will hereafter be described with reference to the accompanying drawings, wherein like reference numerals denote like elements, and.

DETAILED DESCRIPTION OF THE PREFERRED EMBODIMENTS

Figure 1:
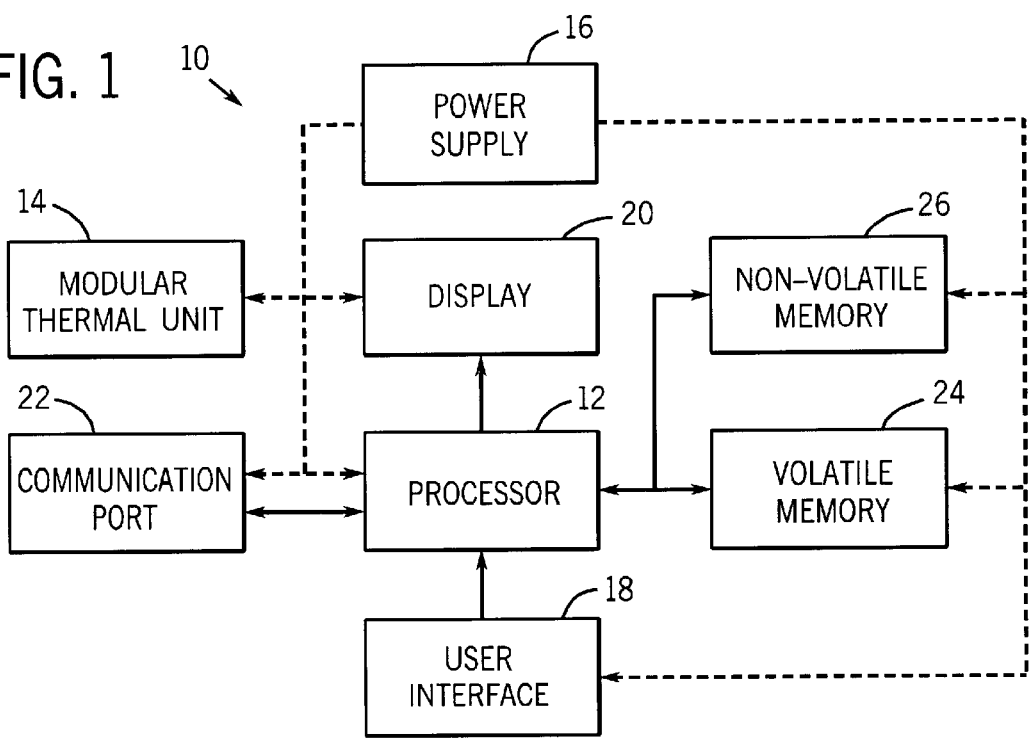
FIG. 1 is a block diagram of a computer system, according to a preferred embodiment of the present invention.

Referring generally to FIG. 1, a block diagram of a computer system, generally designated by the reference numeral 10, is featured. Computer 10 may be any of a variety of different types, such as a notebook computer or a desktop computer. In the illustrated embodiment, a removable processor 12 controls the functions of computer system 10. In this embodiment, data, as illustrated by the solid line, is transferred between the processor and the components of system 10. Additionally, a modular thermal unit 14 is used to remove heat from the processor 12. Computer 10 also includes a power supply 16 to supply electrical power, as illustrated by the dashed line, to the components of computer system 10. Additionally, power supply 16 may include a battery for portable use of computer 10.

Computer system 10 may incorporate various other components depending upon the desired functions of computer 10. In the illustrated embodiment, a user interface 18 is coupled to processor 12. Examples of a user interface 18 include a keyboard, a mouse, and/or a voice recognition system. Additionally, a display 20 is coupled to processor 12 to provide a user with visual information. Examples of a display 20 include a computer monitor, a television screen, or an audio system. In this embodiment a communications port 22 is coupled to processor 12 to enable the computer system 10 to communicate with an external device or system, such as a printer, another computer, or a network.

Processor 12 utilizes software programs to control the operation of computer 10. Electronic memory is coupled to processor 12 to store and facilitate execution of the programs. In the illustrated embodiment, processor 12 is coupled to a volatile memory 24 and non-volatile memory 26. A variety of memory modules, such as DIMMs, DRAMs, SDRAMs, SRAMs, etc., may be utilized as volatile memory 24. Non-volatile memory 26 may include a hard drive, an optical storage, or another type of disk or tape drive memory. Non-volatile memory 26 may include a read only memory (ROM), such as an EPROM, to be used in conjunction with volatile memory 24.

Figure 2:
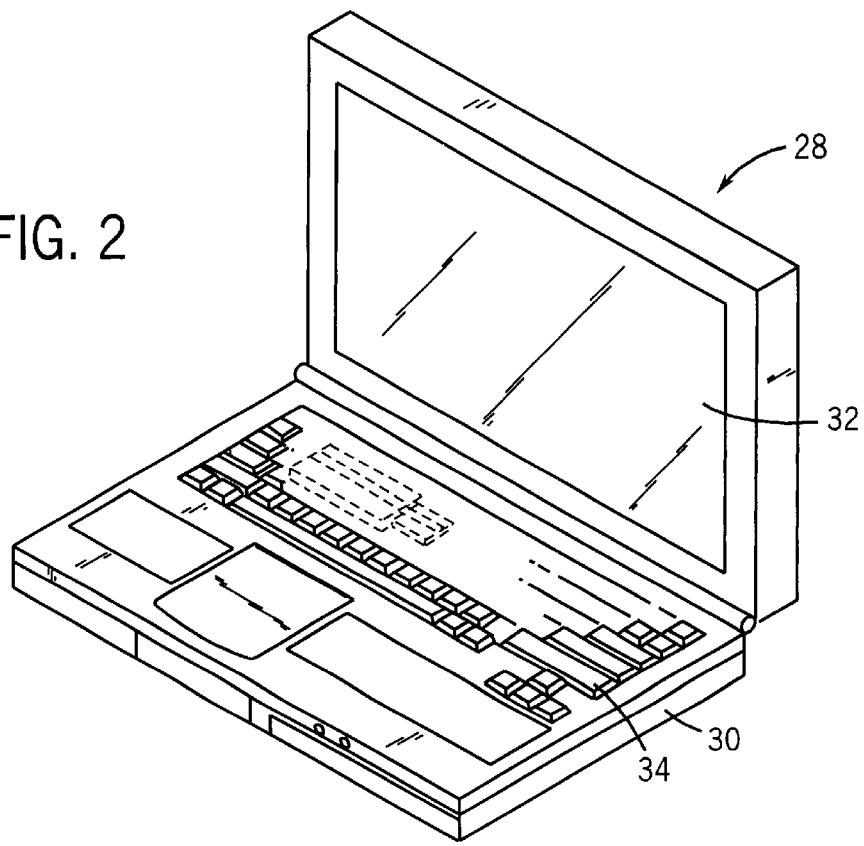
FIG. 2 is a front view of a notebook computer, according to a preferred embodiment of the present invention.

Referring generally to FIG. 2, a notebook computer 28 having a removable processor 12 and a removable modular thermal unit 14 is featured. Notebook computer 28 has a base unit 30 and a monitor 32 hinged to base unit 30. Additionally, notebook computer 28 has a keyboard 34. The base unit of notebook computer 28 may also have other features, such as a mouse pad, modem, disc drive, CD-Rom, video processors, and controller chips.

Figure 3:
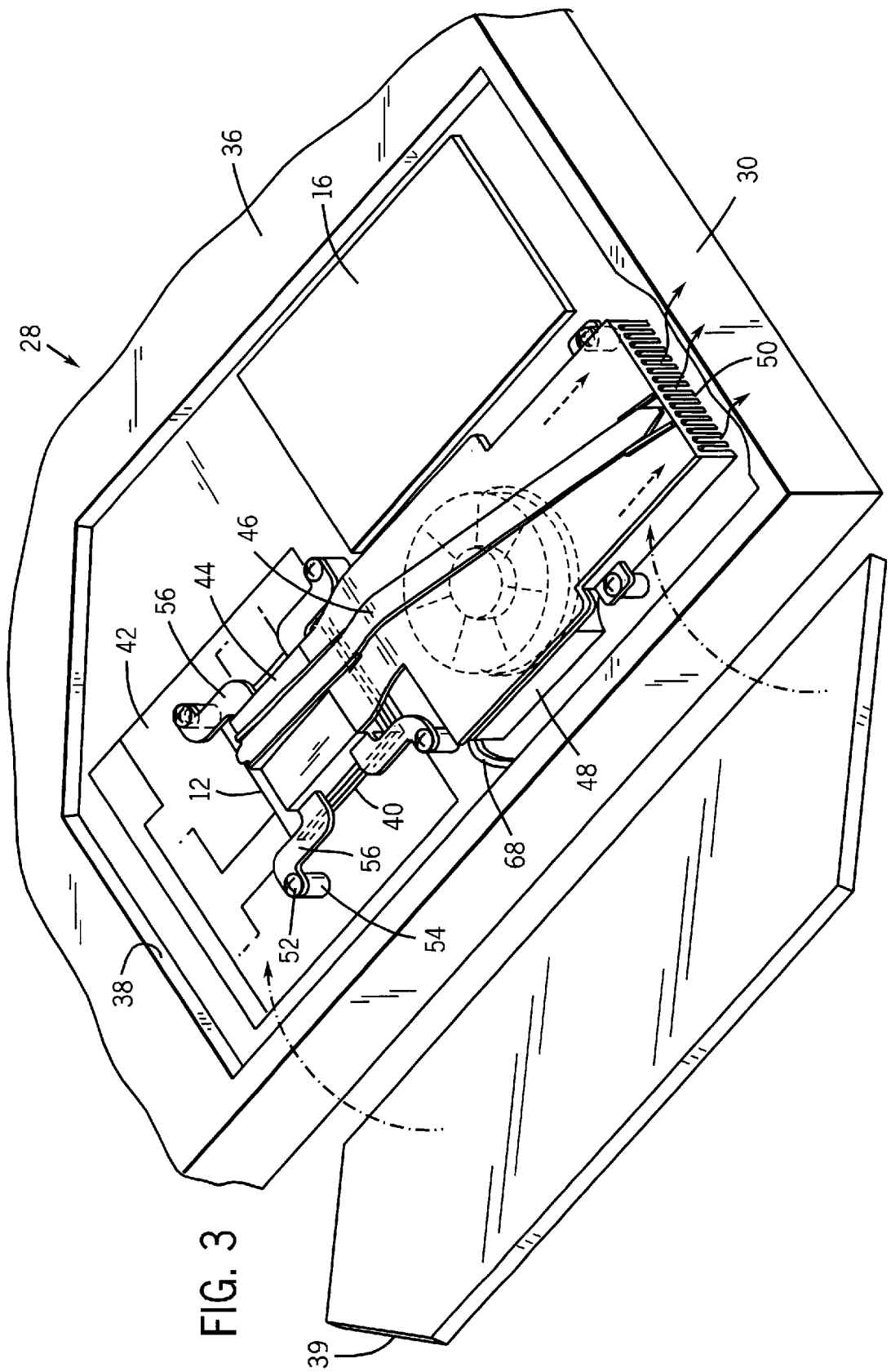
FIG. 3 is a bottom view of the computer of FIG. 2 illustrating a removable modular thermal unit for cooling a removable processor within the notebook computer.

Referring generally to FIG. 3, removable processor 12 and modular thermal unit 14 are accessible from the bottom 36 of base unit 30, in this embodiment. Bottom 36 has an opening 38 and a removable cover 39 that enables access into notebook computer 28 when the cover is removed. Processor 12 is installed in a chip holder 40 mounted on a processor board 42. Processor 12 and chip holder 40 are configured for mating engagement, not soldered engagement. In the exemplary embodiment, with modular thermal unit 14 removed, processor 12 can be removed by applying a lifting force to processor 12 to remove the processor 12 from chip holder 40. Chip holder 40 couples processor 12 to the other components of notebook computer 28.

In the illustrated embodiment, modular thermal unit 14 is disposed within base unit 30 in close proximity to processor 12. Alternatively, modular thermal unit 14 may be disposed in close proximity to a different component to be cooled, such as a video processor, a controller chip, a power supply, etc. In the illustrated embodiment, modular thermal unit 14 comprises the primary cooling elements used to cool processor 12 and incorporates them into a single removable unit. In the illustrated embodiment, modular thermal unit 14 comprises a heat sink portion 44, a heat pipe 46, a cooling fan 48, and a plurality of cooling fins 50. Modular thermal unit 14 is secured to base unit 30 by six screws 52 threaded into six stand-offs 54. However, a greater or lesser number of screws may be used.

In the illustrated embodiment, four of the screws 52 are inserted through four arms 56 extending from modular thermal unit 14. The stand-offs 54 and arms 56 position the heat sink portion 44 into close proximity with processor 12. Additionally, the four arms 56 provide the heat sink portion 44 with a limited freedom of movement vertically. The vertical freedom enables the heat sink portion to come into close proximity to processor 12 without crushing processor 12.

Figure 4:
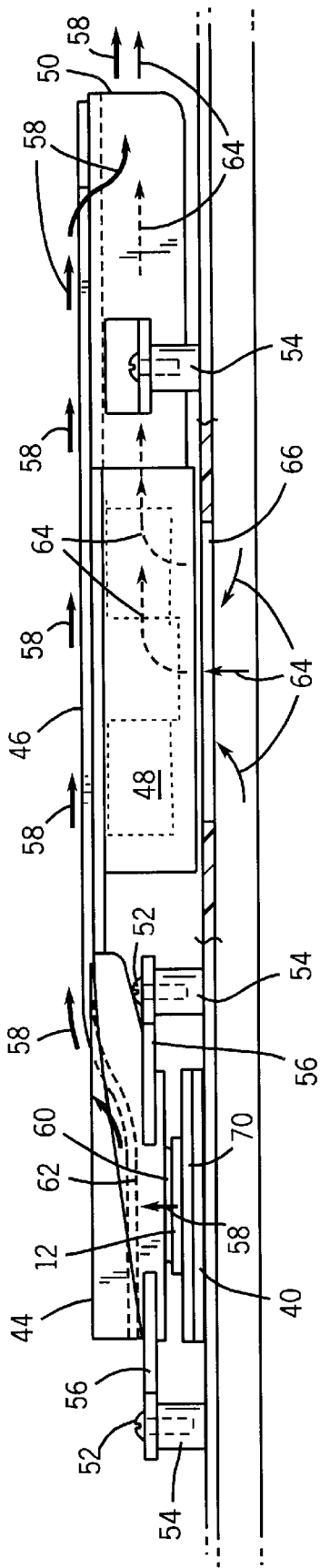
FIG. 4 is a side view of the modular thermal unit, processor, and processor mounting socket arrangement of FIG. 3.

Referring generally to FIGS. 3 and 4, the modular thermal unit 14 is used to remove heat, as referenced by arrows 58, produced by processor 12 from the system. In an exemplary embodiment, the modular thermal unit 14 is composed primarily of a thermally conductive material, such as aluminum.

The heat sink portion first removes the heat from the processor 12 by conduction. A layer of thermal grease 60 is used to form a thermally conductive bridge between the processor 12 and the heat sink portion 44. In the illustrated embodiment, a heat pipe 46 is used to transfer the heat from the heat sink portion 44 to the cooling fins 50. Heat pipe 46 is hollow and contains a fluid, such as water, at a vacuum pressure to lower its boiling point. The heat transferred to the heat pipe 46 from the heat sink portion 44 produces a phase change from liquid to gas within the heat pipe 46. The gas flows through the heat pipe 46 to the region of the heat pipe 46 adjacent to the cooling fins 50, where the heat of the gas within the heat pipe 46 is transferred to the cooling fins 50. As the gas cools, another phase change from gas to liquid occurs.

In the illustrated embodiment, the heat pipe 46 is shaped to direct the liquid to the portion 62 of the heat pipe 46 adjacent to the processor 12 when the computer 28 is in an upright position. Alternatively, a thermally conductive material, such as a metal strip, could be used to transfer the heat from the heat sink portion 44 to the cooling fins 50, rather than heat pipe 46.

Fan 48 blows air over the cooling fins 50 to remove the heat. Fan 48 draws in air, as referenced by arrows 64, through an opening 66. Opening 66 is in fluid communication with the exterior of the device. The heat is transferred to the air from the fins 50 by convection. The heat is ultimately removed from the system with the air. Fan 48 is supplied power by a cable 68 connected to a power connector.

Modular thermal unit 14 may utilize other methods of cooling. For example, modular thermal unit 14 can be configured to cool processor 12 using a thermoelectric cooling system. Thermoelectric cooling takes advantage of a phenomenon known as the Peltier effect. In thermoelectric cooling, current is passed through the junction of two dissimilar materials. This causes heat to be transferred from one side of the junction to the other, producing a cold side and a hot side. The flow of heat is reversed when the direction of current flow is reversed. Typically, semiconductor materials are used in thermoelectric cooling systems.

Figure 5:
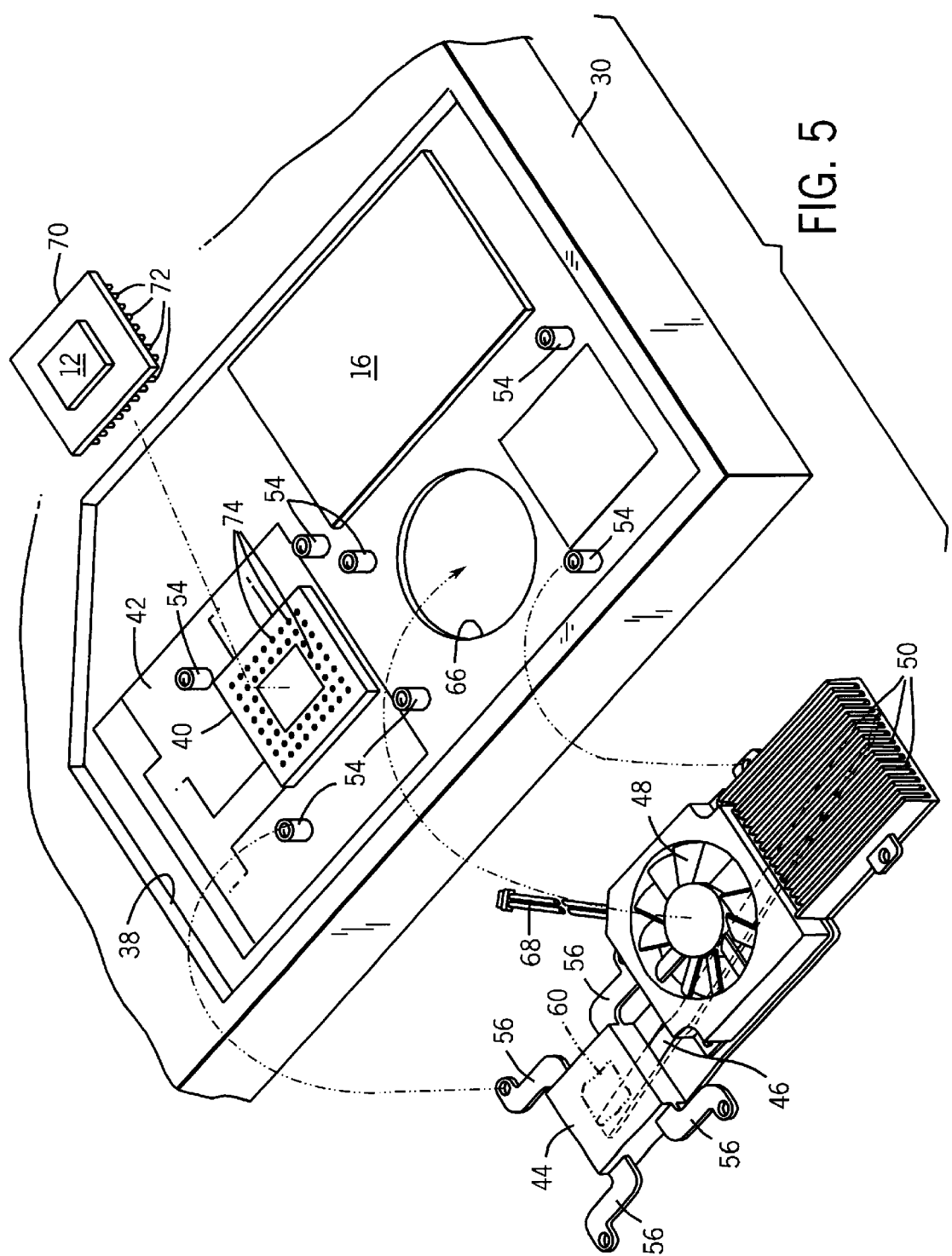
FIG. 5 is a bottom view of the computer of FIG. 2 illustrating the removal of the modular thermal unit and processor from the computer.

Referring generally to FIG. 5, the processor and modular thermal unit 14 are both removable so that either or both can be removed and/or replaced. In the illustrated embodiment, processor 12 is housed within a package 70 that is configured with a plurality of pins 72. The plurality of pins 72 are configured for insertion into a corresponding plurality of sockets 74 within chip holder 40. The plurality of pins 72 and sockets 74 are configured for mating engagement. The pin-and-socket arrangement is used to couple processor 12 to circuit board 42. However, other configurations can be used to removably couple processor 12 to circuit board 42.

The heat removal capacity of a modular thermal unit can be affected by a number of factors. For example, in a modular thermal unit that uses a fan to remove heat, changes in the fan speed will affect the ability of the modular thermal unit to remove heat. Additional factors that can affect the heat removal capacity of a modular thermal unit include the size of the fan, the shape, angle, and the number of fan blades, the shape and the number of cooling fins, as well as the material used to conduct heat through the modular thermal unit.

However, the selection of desirable heat removal factors in the design of a modular thermal unit can result in other undesirable effects. For example, operating a fan at a higher speed requires more energy and produces more noise. Noise reduction and energy consumption may be important factors in the design of a portable electronic product. Thus, a fan that operates at a higher speed than is necessary to remove the heat produced by a given processor produces more noise and consumes more energy than is necessary. The present embodiment enables a modular thermal unit to be configured specifically for use with a specific processor. Thus, a modular thermal unit can be configured to remove the heat produced by a given processor and to minimize the noise level and energy consumed by the modular thermal unit.

The removable nature of processor 12 and modular thermal unit 14 enables an installed processor to be replaced by a processor that produces a greater amount of heat than the installed modular thermal unit can remove. In addition to replacing the installed processor, a replacement modular thermal unit that can remove the greater amount of heat produced by the replacement processor is installed along with the replacement processor.

Alternatively, improvements in processor technology could result in a processor that produces less heat for the same computing power. Thus, it may be desirable to replace an installed processor with a replacement processor that produces less heat. In this event, a replacement modular thermal unit can be configured to remove less heat than an installed modular thermal unit. Such a replacement modular thermal unit would be expected to consume less energy to remove heat, producing energy savings, longer portable operation, and noise reduction.

It will be understood that the foregoing description is of preferred exemplary embodiments of this invention, and that the invention is not limited to the specific forms shown. For example, the modular thermal unit can be configured in a variety of embodiments. For example, the modular thermal unit can be a refrigeration unit. Additionally, a processor can be removably mounted in a variety of ways besides a pin-and-socket configuration. These and other modifications may be made in the design and arrangement of the elements without departing from the scope of the invention as expressed in the appended claims.

What is claimed is:

1. An electronic device, comprising:
    a removable processor;
    a removable modular thermal unit that may be positioned adjacent to the removable processor to remove heat from the removable processor, wherein the modular thermal unit comprises a fan and a plurality of cooling fins, wherein heat from the removable processor is transferred to the cooling fins and the fan is operable to produce a flow of air to cool the cooling fins by convection; and
    a movable cover adapted to enable the modular thermal unit to be removed from the electronic device.

2. The device as recited in claim 1, further comprising a protective enclosure, wherein the removable processor and modular thermal unit are disposed within the protective enclosure.

3. The device as recited in claim 2, wherein the protective enclosure comprises an opening into the protective enclosure and a movable cover over the opening.

4. The device as recited in claim 2, further comprising:
    a processor mounting assembly configured to removably secure the removable processor.

5. The device as recited in claim 4, further comprising:
    a modular thermal unit mounting assembly to removably secure the modular thermal unit.

6. The device as recited in claim 5, wherein the modular thermal unit comprises a thermally conductive portion to conduct heat from the removable processor, wherein the modular thermal unit mounting assembly positions the thermally conductive portion in close proximity to the removable processor.

7. The device as recited in claim 6, further comprising a layer of thermal grease disposed between the removable processor and the thermally conductive portion to form a thermal bridge.

8. The device as recited in claim 1, wherein the modular thermal unit comprises a thermal conduit to transfer heat from the thermally conductive portion to the cooling fins.

9. The device as recited in claim 8, wherein the thermal conduit is a heat pipe.

10. A method of operating a computer system, comprising:
    moving a cover to access an opening in the computer system;
    removing a first modular thermal unit and a first removable processor from the computer system through the opening; and
    installing a second removable processor and a second modular thermal unit into the computer system, wherein the second removable processor produces a greater amount of heat than the first removable processor and the second modular thermal unit removes a greater amount of heat than the first modular thermal unit.

11. The method as recited in claim 10, wherein the first modular thermal unit and first removable processor are disposed within an interior portion of an enclosure, the method further comprising accessing the interior portion of the enclosure.

12. The method as recited in claim 11, wherein accessing comprises displacing a cover from an opening into the interior portion of the enclosure.

13. The method as recited in claim 10, wherein removing comprises removing the first modular thermal unit to gain access to the first removable processor.

14. The method as recited in claim 13, wherein removing comprises providing a lifting force to lift the first removable processor from a mounting assembly.

15. The method as recited in claim 10, wherein installing comprises placing thermal grease between the second removable processor and the second modular thermal unit.

16. An electronic device, comprising:
    an enclosure, wherein the enclosure comprises a movable cover to enable a removable modular thermal unit comprising a fan and a heat pipe to be installed within the enclosure;
    a first mounting assembly disposed within the enclosure, the first mounting assembly being adapted to hold a removable component; and
    a second mounting assembly disposed within the enclosure, the second mounting assembly being adapted to secure the removable modular thermal unit to the enclosure.

17. The device as recited in claim 16, wherein the removable component is a removable processor.

18. The device as recited in claim 16, further comprising the removable modular thermal unit.

19. The device as recited in claim 17, wherein the removable modular thermal unit is secured to the enclosure by a plurality of arms, each arm extending outward from the modular thermal unit to a securing member.

20. A method of assembling an electronic device, comprising:
    configuring a first removable modular thermal unit with a first cooling fan adapted to remove heat produced by a first removable processor;
    adapting a second removable modular thermal unit with a second cooling fan adapted to remove heat produced by a second removable processor, wherein the second removable processor produces a greater amount of heat during operation than the first processor, the second removable processor and second removable modular thermal unit being configured to replace the first removable processor and first removable modular thermal unit in the electronic device via an opening in the electronic device; and
    disposing a cover over the opening.

21. The method as recited in claim 20, comprising:
    replacing the first removable processor and the first removable modular thermal unit with the second removable processor and the second removable modular thermal unit.

* * * * *